United States Patent
Sugai

(10) Patent No.: US 6,509,649 B1
(45) Date of Patent: *Jan. 21, 2003

(54) SEMICONDUCTOR DEVICE AND FABRICATING METHOD THEREOF

(75) Inventor: Kazumi Sugai, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/499,147

(22) Filed: Feb. 7, 2000

(30) Foreign Application Priority Data

Feb. 8, 1999 (JP) .......................................... 11-029720

(51) Int. Cl.⁷ .............................................. H01L 23/48
(52) U.S. Cl. ...................................... 257/758; 257/767
(58) Field of Search ................................ 257/758, 767, 257/751, 915

(56) References Cited

U.S. PATENT DOCUMENTS 5,572,072 A * 11/1996 Lee ............................ 257/915
5,760,475 A * 6/1998 Cronin et al. ............... 257/758
6,060,784 A * 5/2000 Oda ............................ 257/915
6,069,069 A * 5/2000 Chooi et al. ................ 438/631

FOREIGN PATENT DOCUMENTS

| JP | 5-326512 | | 12/1993 |
|----|----------|---|---------|
| JP | 8-111455 | | 4/1996 |
| JP | 9-172072 | * | 6/1997 |
| JP | 09-260379 | | 10/1997 |
| JP | 10-199973 | | 7/1998 |
| JP | 10-294314 | | 11/1998 |
| JP | 11-204526 | | 7/1999 |

* cited by examiner

Primary Examiner—Mark V. Prenty
(74) Attorney, Agent, or Firm—Choate, Hall & Stewart

(57) ABSTRACT

First, a lower layer wiring is formed on a semiconductor substrate. Then, an interlayer insulating film is formed on the lower layer wiring. Next, a first Ti film is formed on the interlayer insulating film. Thereafter, a TiN film is formed on the first Ti film. Then, a via hole is formed in the TiN film, the first Ti film and the interlayer insulating film such as to reach the lower layer wiring. Then, a second Ti film and an Al or Al alloy film are sequentially formed in the via hole and on the TiN film. Next, a thermal treatment is carried out, thereby allowing Ti in the second Ti film and Al in the Al or Al alloy film to react with each other in a bottom of the via hole.

9 Claims, 2 Drawing Sheets

SEMICONDUCTOR DEVICE AND FABRICATING METHOD THEREOF

BACKGROUND OF THE INVENTION

1. Field of the Invention

The present invention relates to a semiconductor device suitable for a circuit which is operated at a high speed, such as a logic device, and to a fabricating method of such a semiconductor device, and more particularly, to a semiconductor device having excellent electro-migration resistant ability and to a fabricating method of such a semiconductor device.

2. Description of Related Art

In a semiconductor device, a density of current flowing through a wiring is increased due to a downsizing tendency of recent design rule and with this fact, a problem that reliability is lowered, which is called electro-migration, comes to the surface. In the electro-migration, Al atoms flow in the same direction as electrons, and after the Al atoms flow out, a void is formed in a place where Al atoms can not be supplied, and a wiring break and the like are caused.

Thereupon, a method for enhancing the reliability is employed by adding trace Cu to Al which is material of the wiring, or by forming a film made of TiN and Ti under the Al wiring as a barrier metal film.

However, even when Cu is added to Al, sufficient effect can not be obtained. When the barrier metal film made of TiN and Ti is formed, since the barrier metal film is also formed on a bottom of a via, the TiN film inhibits the flow of Al atoms reversely. Therefore, a void is formed in the via, the wiring is broken, and large-scale integrated circuit (LSI) and the like are not operated.

Thereupon, a method for forming only a Ti film as the barrier metal film under an upper layer wiring made of Al alloy is disclosed in Japanese Patent Application Laid-open No. 5-326512, Japanese Patent Application Laid-open No. 8-111455and Japanese Patent Application Laid-open No. 10-199973. According to this method, since no TiN film exists in the barrier metal film, Al atoms can move between the upper layer wiring and the lower layer wiring, and the electro-migration is suppressed.

However, in the fabricating method of a semiconductor device described in those publications, although the electro-migration in a via can be suppressed, there is a problem that electro-migration in the upper layer wiring can not be suppressed sufficiently.

SUMMARY OF THE INVENTION

It is an object of the present invention to provide a semiconductor device capable of sufficiently suppressing electro-migration in a via and an upper layer wiring, and a fabricating method of such a semiconductor device.

According to one aspect of the present invention, a semiconductor device comprises: a semiconductor substrate; a lower layer wiring formed on the semiconductor substrate; an interlayer insulating film formed on the lower layer wiring; a via hole formed in the interlayer insulating film and reaching the lower layer wiring; a barrier metal film embedded in a bottom of the via hole and made of refractory metal; a conductive film formed on the barrier metal film; and an upper layer wiring having a first Ti film, a TiN layer, a second Ti film and an Al or Al alloy film which are sequentially laminated on the interlayer insulating film. The upper layer wiring is connected to the conductive film.

In the present invention, since the barrier metal film comprises the metal film made of refractory metal, a problem with respect to the movement of Al atoms caused in the conventional semiconductor device in which a TiN film is formed does not exist. Therefore, the electro-migration resistant ability in a via is high. Further, in the upper layer wiring, since the first Ti film, the TiN layer and the second Ti film are formed under the Al or Al alloy film, the orientation property of the Al or Al alloy film is high, and a variation in crystal particle diameter is small in the wiring. Therefore, the electro-migration resistant ability in the upper layer wiring is high.

According to another aspect of the present invention, a fabricating method of a semiconductor device invention comprises a step of forming a lower layer wiring on a semiconductor substrate. Then, in this fabricating method, an interlayer insulating film is formed on the lower layer wiring. Next, a first Ti film is formed on the interlayer insulating film. Thereafter, a TiN film is formed on the first Ti film. Then, a via hole is formed in the TiN film, the first Ti film and the interlayer insulating film such as to reach the lower layer wiring. Then, a second Ti film and an Al or Al alloy film are sequentially formed in the via hole and on the TiN film. Next, a thermal treatment is carried out, thereby allowing Ti in the second Ti film and Al in the Al or Al alloy film to react with each other in a bottom of the via hole.

In the present invention, the via hole is formed after the first Ti film and the TiN film are formed on an interlayer insulating film and then, the second Ti film and the Al or Al alloy film are formed. Therefore, the TiN film is not formed in the via hole, and the electro-migration resistant ability in the via hole is high. Furthermore, in the upper layer wiring, since the orientation property of the Al or Al alloy film is high and a variation in crystal particle diameter is small as described above, the electro-migration resistant ability in the upper layer wiring is also high.

DETAILED DESCRIPTION OF THE PREFERRED EMBODIMENT

A fabricating method of a semiconductor device according to an embodiment of the present invention will be explained particularly with reference to the accompanying drawings below. The method of the present embodiment is for fabricating a silicon integrated circuit having a plurality of wirings. FIGS. 1A to 1E are sectional views showing the fabricating method of the semiconductor device according to the embodiment of the present invention in the order of fabricating steps.

Figure 1A:
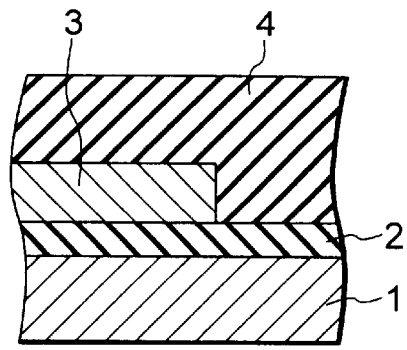
FIGS. 1A to 1E are sectional views showing a fabricating method of a semiconductor device according to an embodiment of the present invention in the order of fabricating steps.

First, as shown in FIG. 1A, in the fabricating method of the present embodiment, a first $SiO_2$ film 2 is deposited on a silicon substrate 1, and an Al film 3 is selectively deposited on a predetermined position on the $SiO_2$ film 2. The Al film 3 serves as a lower layer wiring. Then, a second $SiO_2$ film 4 is deposited on the entire surface.

Figure 1B:
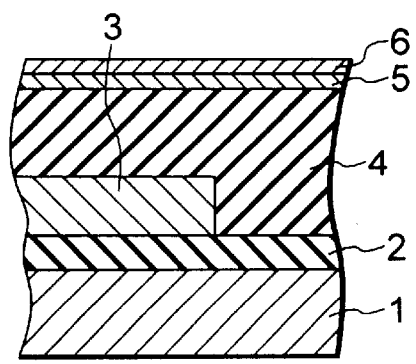

Next, as shown in FIG. 1B, a first Ti film 5 and a first TiN film 6 are sequentially deposited on the entire surface of the second $SiO_2$ film 4 by a sputtering method.

Figure 1C:
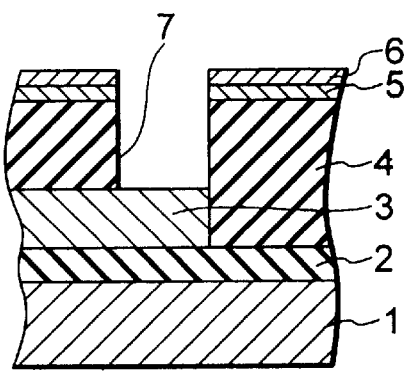

Thereafter, as shown in FIG. 1C, a via hole 7 reaching the Al film 3 (lower layer wiring) is formed in the first TiN film 6, the first Ti film 5 and the second SiO₂ film 4 by a usual lithography and a dry etching.

Figure 1D:
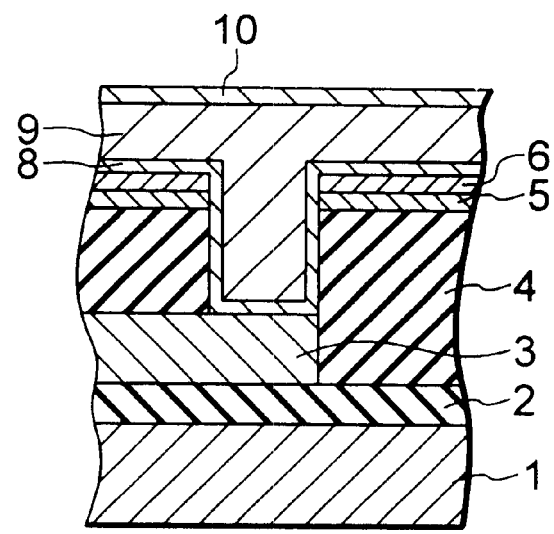

Then, as shown in FIG. 1D, a second Ti film 8 having a film thickness of 100 to 1,000 Å is deposited on the entire surface. At this time, the thickness of the second Ti film 8 at a bottom of the via is set to 300 Å or less. Next, an AlCu alloy film 9 having a thickness of 3,000 to 10,000 Å is deposited on the second Ti film 8. With these steps, a barrier metal film comprising the second Ti film 8 and a via comprising the AlCu alloy film 9 are embedded in the via hole 7. Further, a second TiN film 10 having a thickness of 100 to 1,000 Å is deposited on the AlCu alloy film 9. Examples of the depositing method of these films are a sputtering method, a chemical vapor deposition (CVD, hereinafter) method and a combination thereof. When the sputtering method is used for depositing the films, a magnetron sputtering apparatus or a DC sputtering apparatus for example may be used. When the CVD method is used for depositing the films, a thermal CVD using dimethyl aluminum hydride ((CH₃)₂AlH), for example, may be carried out.

Figure 1E:
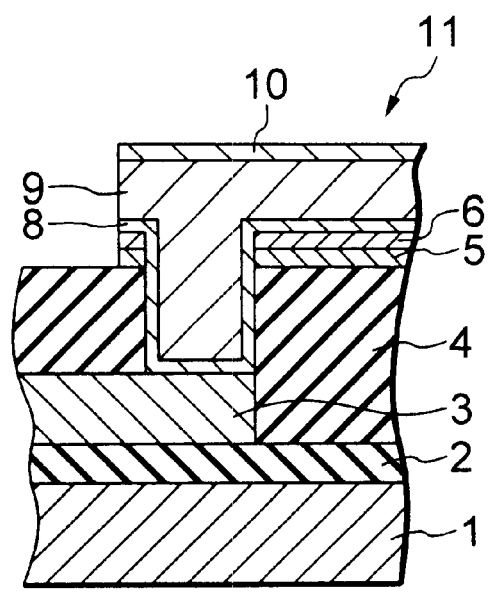

Next, as shown in FIG. 1E, the second TiN film 10, the AlCu alloy film 9, the second Ti film 8, the first TiN film 6 and the first Ti film 5 are patterned by a lithography and a dry etching, thereby forming an upper layer wiring 11.

Next, a thermal treatment is carried out at 400 ° C. in a hydrogen gas atmosphere or an inert gas atmosphere such as nitrogen for 30 minutes, thereby allowing Ti in the second Ti film 8 and Al in the Al film 3 and the AlCu alloy film 9 to react with each other in the via bottom to form a region made of AlTi alloy. This region made of AlTi alloy does not exists as a layer or a film but exists as dots like islands deposited in the Al film 3 and the AlCu alloy film 9. Further, with this step, the second Ti film 8 may disappear in the via bottom, and the Al film 3 and the AlCu alloy film 9 may be directly connected to each other in some cases.

The semiconductor device of the embodiment of the present invention fabricated as described above has a structure as shown in FIG. 1E. When electrons flow from the Al film 3 (lower layer wiring) to the upper layer wiring 11 through the via, Al atoms move from the Al film 3 to the AlCu alloy film 3 in the via bottom without hindrance. Therefore, electro-migration resistant ability in the via bottom is high.

Further, in the upper layer wiring 11, the first Ti film 5, the first TiN film 6 and the second Ti film 8 are formed under the AlCu alloy film 9. Therefore, orientation property of the AlCu alloy film 9 is extremely high and a variation in crystal particle diameter in the AlCu alloy film 9 is small as compared with a conventional AlCu alloy film under which only a Ti film is formed. Thus, the electro-migration resistant ability in the upper layer wiring 11 is high, too.

Although the AlCu alloy film 9 is formed in the upper layer wiring 11 in the above embodiment, another Al alloy film such as an AlSi alloy film or an Al film may be formed in place of the AlCu alloy film 9.

Further, if the thickness of the second Ti film at the via bottom is equal to 300 Å or less, since Al atoms can easily move, higher electro-migration resistant ability can be obtained. Furthermore, the temperature of the thermal treatment should not be limited to 400 ° C., and when the temperature is equal to 300 ° C. or higher, since Ti and Al react with each other easily, the effect of the present invention can be obtained.

According to the present invention, since the barrier metal film made of metal having a high melting point (refractory metal) is provided, it is possible to avoid a problem with respect to the movement of Al atoms caused in the conventional semiconductor device in which a TiN film is formed. Therefore, high electro-migration resistant ability in a via can be obtained. Further, in the upper layer wiring, since the first Ti film, the TiN layer and the second Ti film are formed under the Al or Al alloy film, the orientation property of the Al or Al alloy film is high, and a variation in crystal particle diameter is small. Therefore, it is possible to enhance the electro-migration resistant ability in the upper layer wiring.

Furthermore, according to the present invention, the via hole is formed after the first Ti film and the TiN film are formed on the interlayer insulating film and then, the second Ti film and the Al or Al alloy film are formed. Therefore, it is possible to obtain high electro-migration resistant ability in the via hole. In the upper layer wiring, the orientation property of the Al or Al alloy film is high and a variation in crystal particle diameter is small as described above, it is possible to enhance the electro-migration resistant ability.

What is claimed is:

1. A semiconductor device comprising:

a semiconductor substrate;

a lower layer wiring formed on said semiconductor substrate;

an interlayer insulating film formed on said lower layer wiring;

a via hole formed in said interlayer insulating film and reaching said lower layer wiring;

a barrier metal film consisting essentially of a first Ti film embedded in a bottom of said via hole and made of refractory metal;

a conductive film formed on said first Ti film and connected to said first Ti film; and an upper layer wiring having a second Ti film, a TiN layer, said first Ti film and said conductive film being one of an Al and an Al alloy film which are sequentially laminated on said interlayer insulating film.

2. The semiconductor device according to claim 1, wherein a thickness of said Ti film embedded in a bottom of said via hole is equal to or less than 300 Å.

3. The semiconductor device according to claim 1, wherein said lower layer wiring contains Al.

4. The semiconductor device according to claim 2, wherein said lower layer wiring contains Al.

5. The semiconductor device of claim 1, wherein said conductive film is one of an AlCu alloy film and an AlSi film.

6. The semiconductor device of claim 5, wherein said lower layer wiring contains Al.

7. The semiconductor device of claim 6, further comprising:

at least one region of an AlTi alloy included in one of said conductive film and said lower wiring layer.

8. The semiconductor device of claim 1, wherein said conductive film is one of an AlSi alloy and an AlCu alloy.

9. The semiconductor device of claim 8, wherein said conductive film fills said via hole.

* * * * *